(12) United States Patent
Mutnury et al.

(10) Patent No.: US 9,986,651 B2
(45) Date of Patent: May 29, 2018

(54) METHOD FOR MITIGATING SIGNAL ATTENUATION IN PRINTED CIRCUIT BOARD CONNECTIONS

(71) Applicant: Dell Products, LP, Round Rock, TX (US)

(72) Inventors: Bhyrav Mutnury, Round Rock, TX (US); Sanjay Kumar, Ranchi (IN); Vijendera Kumar, Bangalore (IN); Jaya Gowri Anand Burji, Bangalore (IN); Mallikarjun Goud Vasa, Secunderabad (IN)

(73) Assignee: DELL PRODUCTS, LP, Round Rock, TX (US)

( * ) Notice: Subject to any disclaimer, the term of this patent is extended or adjusted under 35 U.S.C. 154(b) by 211 days.

(21) Appl. No.: 14/928,911

(22) Filed: Oct. 30, 2015

(65) Prior Publication Data

US 2017/0127534 A1    May 4, 2017

(51) Int. Cl.
*H05K 3/42*    (2006.01)

(52) U.S. Cl.
CPC ..................................... *H05K 3/42* (2013.01)

(58) Field of Classification Search
CPC .......... H01L 29/40; H01L 29/301; H05K 3/42
See application file for complete search history.

(56) References Cited

U.S. PATENT DOCUMENTS

| 6,628,725 | B1 | 9/2003 | Adam et al. |
| 6,713,162 | B2* | 3/2004 | Takaya ................. H03H 7/0115 333/184 |
| 7,215,007 | B2* | 5/2007 | McKinzie, III ........... H01P 1/16 257/664 |
| 8,243,782 | B2 | 8/2012 | Mobin et al. |
| 8,633,395 | B2* | 1/2014 | Ohmi ...................... H01L 23/66 174/255 |
| 2008/0304559 | A1 | 12/2008 | Wu et al. |
| 2015/0211837 | A1 | 7/2015 | Mutnury et al. |

FOREIGN PATENT DOCUMENTS

EP    1 643 678 A1    5/2006

* cited by examiner

*Primary Examiner* — Carl Arbes
(74) *Attorney, Agent, or Firm* — Larson Newman, LLP

(57) ABSTRACT

Methods and mechanisms for mitigating attenuation in a printed circuit board connection may include selecting the relative permittivities of resin layers proximate to the connection to control connection frequency resonances such that the attenuation of signals in the connection due to frequency resonance is mitigated.

20 Claims, 8 Drawing Sheets

METHOD FOR MITIGATING SIGNAL ATTENUATION IN PRINTED CIRCUIT BOARD CONNECTIONS

FIELD OF THE DISCLOSURE

The present disclosure generally relates to printed circuit boards, and more particularly relates to mitigating signal attenuation in connections formed with printed circuit boards.

BACKGROUND

As the value and use of information continues to increase, individuals and businesses seek additional ways to process and store information. One option is an information handling system. An information handling system generally processes, compiles, stores, or communicates information or data for business, personal, or other purposes. Technology and information handling needs and requirements can vary between different applications. Thus information handling systems can also vary regarding what information is handled, how the information is handled, how much information is processed, stored, or communicated, and how quickly and efficiently the information can be processed, stored, or communicated. The variations in information handling systems allow information handling systems to be general or configured for a specific user or specific use such as financial transaction processing, airline reservations, enterprise data storage, or global communications. In addition, information handling systems can include a variety of hardware and software resources that can be configured to process, store, and communicate information and can include one or more computer systems, graphics interface systems, data storage systems, networking systems, and mobile communication systems.

Information handling systems may include printed circuit boards (PCBs).

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings indicates similar or identical items.

DETAILED DESCRIPTION OF THE DRAWINGS

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

As would be understood by one of skill in the art, electronic systems, devices, and components may be formed on PCBs. A PCB generally has multiple layers. Generally a PCB has alternating layers of a resin material layer and a trace layer. Multiple components on the PCB board are electrically connected as desired by the trace layers while the resin layers isolate the trace layers. The resin layers may be unconductive and have a respective relative permittivity ($\epsilon_r$) defining a dielectric constant of the resin. More particularly, the resin layers may isolate trace layers from each other both physically and electrically and provide shielding between layers and components of an electrical system.

In order to couple components to a PCB, pins or blades of a component may be soldered to corresponding electrical connections formed on the PCB. In some embodiments of PCBs, the connection may be solder pads formed on a surface of the PCB and connected to one or more trace layers of the PCB. With regard to embodiments discussed herein, the connection may be a connection hole formed in the PCB and connected to one or more trace layers of the PCB. The connection hole may be plated with a conducting metal, or otherwise be metalized around the perimeter of the hole to provide a conductive connection into which a pin or blade of a component may be inserted. Subsequent to insertion into a connection hole on a PCB, a pin or blade is usually soldered to a portion of the metallic perimeter of the connection hole. Connection holes have structural advantages over solder pads, as the pin or blade, and thus the associated component, is physically supported in position by the walls of the connection hole of the PCB.

However, the unsoldered portion of the pin and connector hole may act as resonating stubs and cause signal attenuation at the connection at frequencies associated with the frequency resonances of the resonating stubs. To mitigate this attenuation, the relative permittivity of one or more resin layers may be chosen to 'dampen' the resonating frequencies and thereby mitigate attenuation at those frequencies.

Figure 1A:
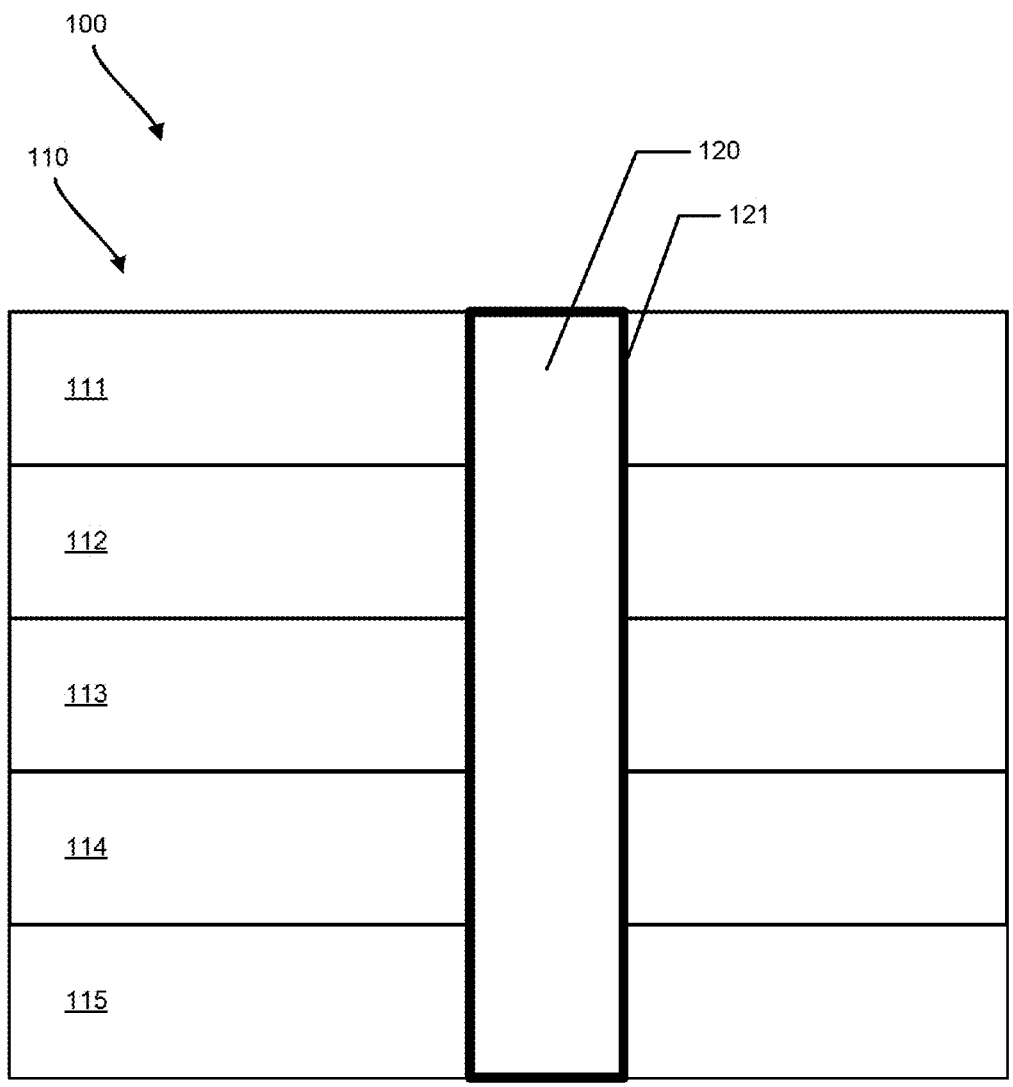
FIGS. 1a and 1b are schematic diagrams of embodiments of PCB systems.

FIG. 1a shows a simplified PCB system 100 with a though-hole connection hole. PCB 110 comprises multiple layers 111-115 and connection hole 120, which as can be seen from 100 is a through-hole connection. More particularly, PCB 110 has conduction layers 112 and 114, and isolating layers 111, 113, and 115, which are formed of a resin with a relative permittivity that electrically isolates conducting layers 112 and 114 from each other. As can be seen from 100, conduction and isolating layers alternate, as indicated by the numbering of the layers, even numbers for conduction layers and odd numbers for resin (isolating) layers. Furthermore, the walls of connection hole 120 are plated with a conducting material, often metallic, such as a copper alloy with desirable conductive properties, to form conduction wall 121. Thus, connection hole 120 may provide an electrical connection to conduction layers 112 and 114 because conduction wall 121 may be in electrical contact with conduction layers 112 and 114.

Figure 1B:
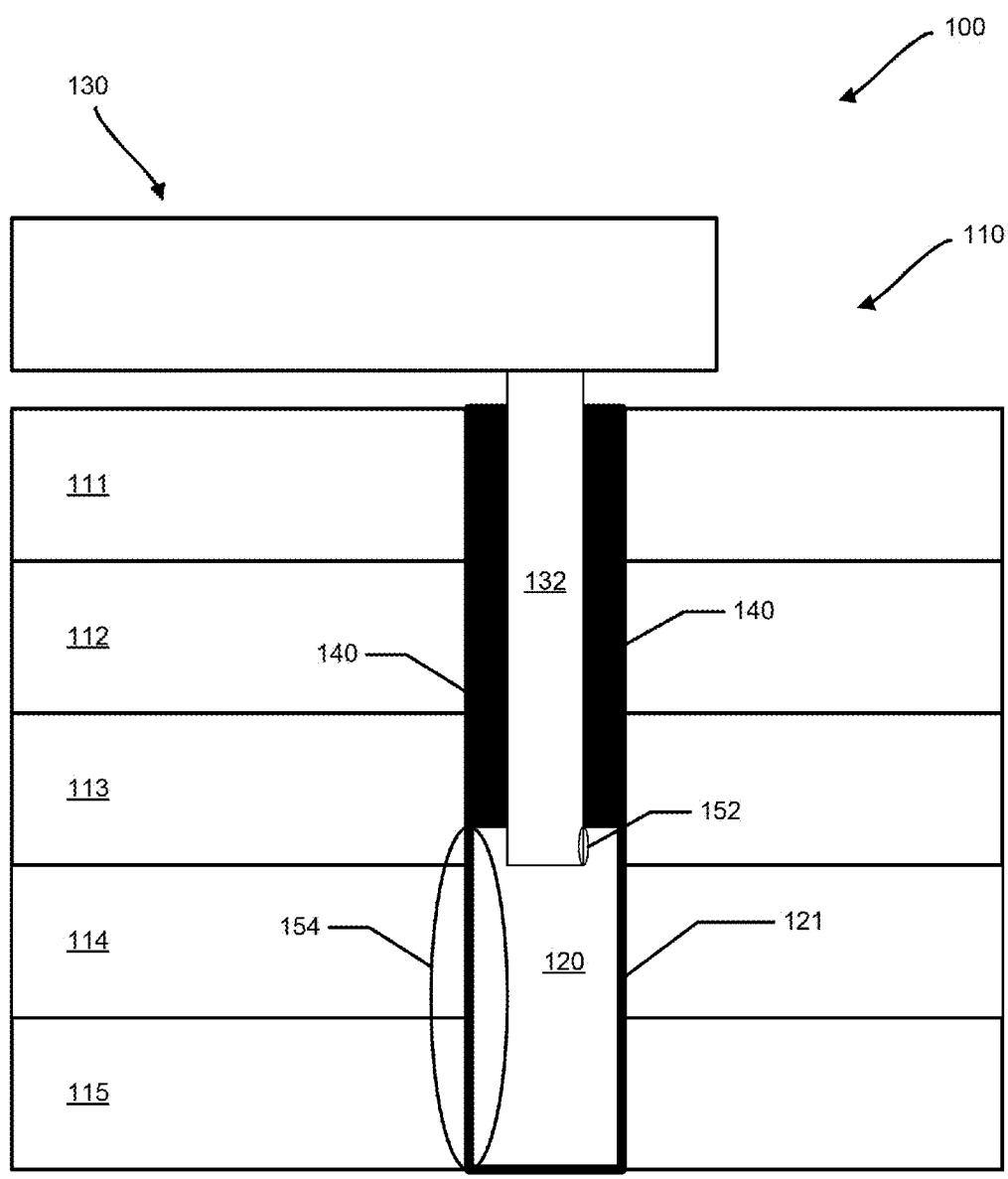

FIG. 1b shows a simplified PCB system 100 with an electrical component coupled to connection hole 120. Electrical component 130 is coupled to PCB 110. Electrical component 130 has a connector pin 132 positioned in connection hole 120. Connector pin 132 is soldered to conduction wall 121 with solder portions 140 such that connector pin 132 is electrically connected to conduction wall 121. Because connector pin 132 is electrically connected to conduction wall 121, connector pin 132 may also be electrically connected to at least one of conduction layers 112 and 114 via conduction wall 121. As can be seen from FIG. 1b, a portion 152 of connector pin 132 may extend beyond the solder portions 140, and may be though of as a stub 152. Similarly, a portion 154 of conduction wall 121 extends beyond the solder portions 140, and may be though of as a stub 154.

The solder portions 140 directly soldering connector pin 132 to conduction wall 121 may be thought of as the electrical connection between connector pin 132 and conduction wall 121. Any conducting portions of connector pin 132 and conduction wall 121 extruding beyond the electrical connection are thus stubs and may have negative effects on the connection. For example, stubs 152 and 154 extrude beyond the electrical connection, and may cause the connection to have resonances and attenuations at frequencies associated with a length of the stub.

For example, a stub has a frequency resonance at:

$$fo = \frac{c}{4 * Stub\_Length * \sqrt{Dkeff}} \quad \text{Equation 1}$$

Where $f_o$ is resonance frequency, c is Speed of light (1.18E10 inches/sec), Dkeff is Effective Dielectric Constant and Stub_length is Via stub length.

Thus, the longer a stub associated with an electrical connection, the lower the frequency at which the stub will have an effect on signal propagation through the connection. In order to reduce the length of a conduction wall stub such as stub 154, and thereby push out the frequencies affected by the stub at a connection, connection hole 120 may be backdrilled to minimize the length of conduction wall 121 that extends beyond the solder connection.

Figure 2A:
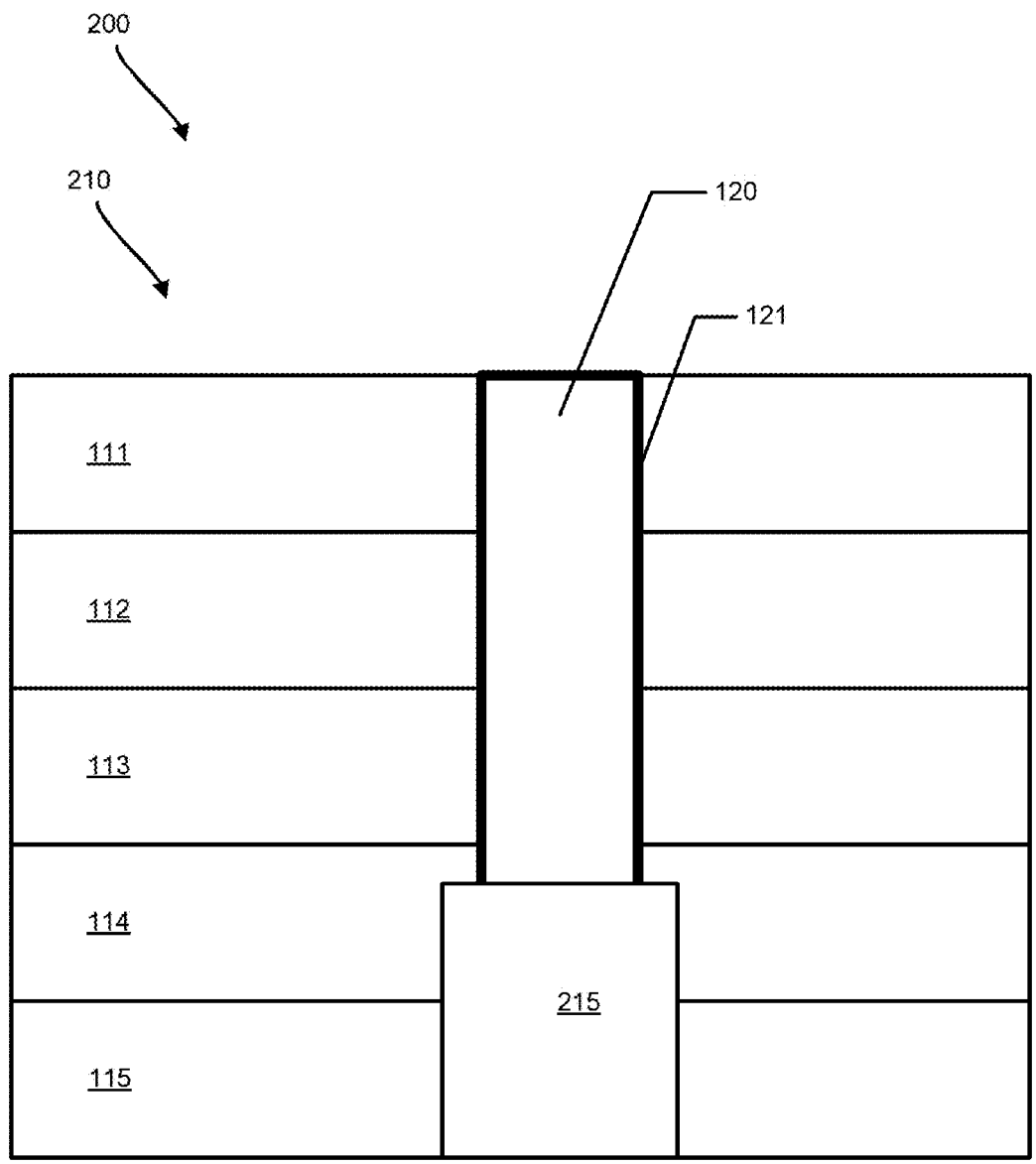
FIGS. 2a and 2b are schematic diagrams of embodiments of PCB systems.

FIG. 2a shows a simplified PCB system 200 which is similar to PCB system 100, but with backdrilling. In 200, connection hole 120 is backdrilled with backdrill 215. To backdrill 215, a portion of conduction wall 121 is drilled out (backdrilled) such that the conducting material of conduction wall 121 is removed for the length of backdrill 215.

Figure 2B:
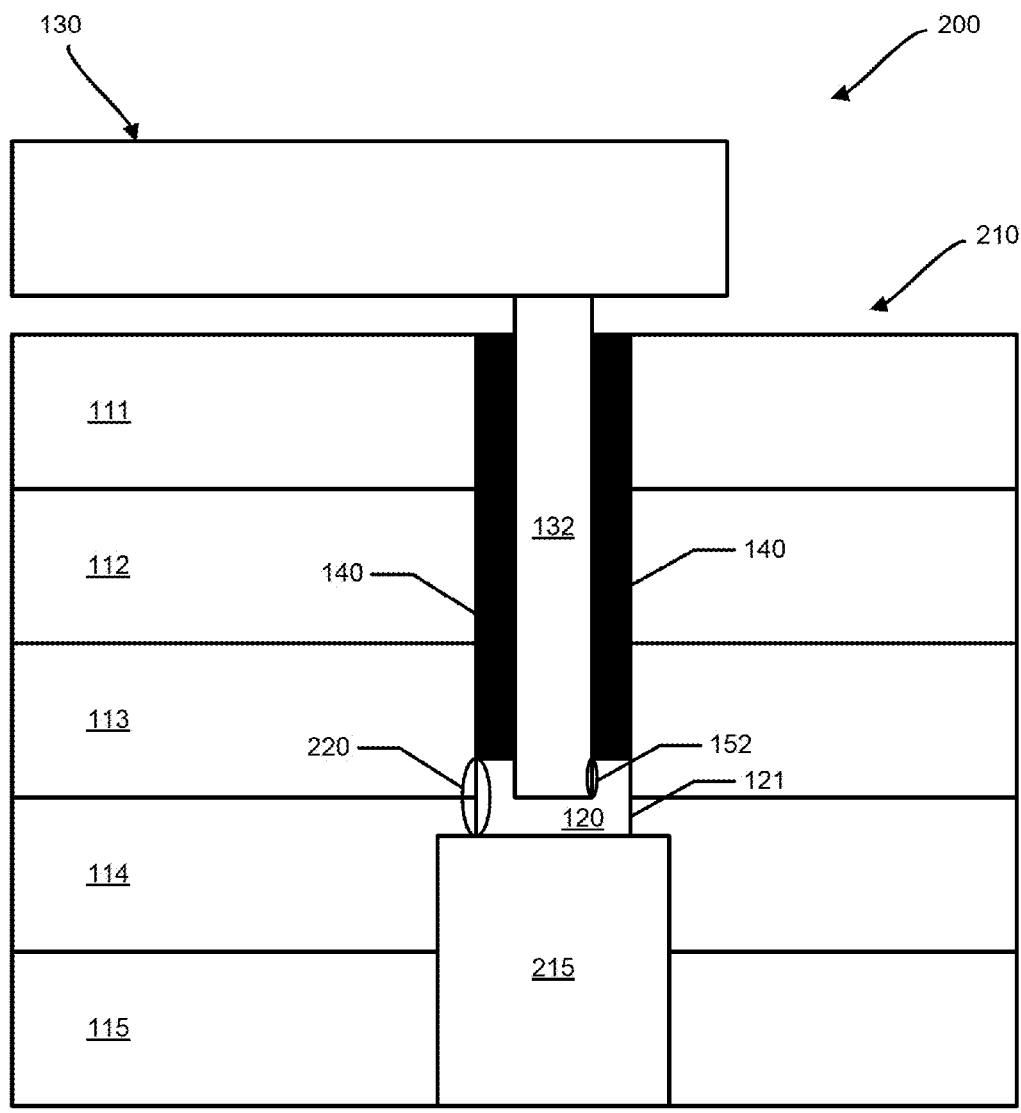

FIG. 2b shows PCB system 200 with an electrical component coupled to backdrilled connection hole 120. As can be seen from 200, the backdrilling reduces the length of the stub resulting from the unsoldered portions of conduction wall 121. That is, backdrill 215 has left a portion 220 of conduction wall 121 extending beyond the solder portions 140, and portion 220 may be thought of as stub 220. As is clearly seen from comparing FIGS. 1b and 2b, stub 220 of backdrilled PCB 210 is shorter than stub 154 of PCB 110. Thus, the frequencies affected by the conduction wall stub will be pushed out, or increased, relative to an unbackdrilled conduction wall stub which may extend for the length of the connection hole through the PCB from the solder connection.

Backdrilling to reduce conduction wall stubs has an inherent limitation in that the connection hole should generally be backdrilled before the pin is positioned in the connection hole and soldered. That is, the connection holes of the PCB are generally backdrilled prior to connecting and soldering components to the PCB (to avoid layer ruptures), and as such, the backdrilling must be performed with tolerances which provide for some length of conduction wall stub. As the frequencies used in PCB components and devices increases, the resonant frequency and attenuation in a connection due to the associated conduction wall stub may affect the propagation of signals in used frequencies. Therefore, as the used frequency of signals in a PCB increases, it is desired to mitigate the effects of a conduction wall stub in a connection hole connection.

While FIGS. 1a-2b show a simplified PCB board, a simplified component, and a simplified connection, it should be understood that modern PCBs often have may more layers and both the front and back sides of the PCB may be used for mounting components. Thus one or more connection holes on both the front and back of a PCB may be backdrilled prior to mounting components, depending on whether the component is to be mounted on the front or back of the PCB. Furthermore, with high speed components that operate at higher frequencies, at least 40 mils of connector pin length are required for good mechanical mating in a connection. This 40 mil length of connector pin length empirically means that 1-3 conduction layers of the top and bottom of the PCB (when both top and bottom sides are used to mount components) cannot be used to connect components because of the punctuation of connector pins into those topical layers.

To mitigate the effects of stubs in a connection hole connection of a PCB, the relative permittivity of the resin layers of the PCB may be modified such that resin layers traversed by the length of the connector pin (the topical 1-3 resin layers) have an increased or decreased relative permittivity relative to the usual relative permittivity of the resin layers. That is to say, prior to manufacturing the PCB, the resin material of topical resin layers may be selected with a relative permittivity that is lower than the relative permittivity of the resin material of choice by 0.5 to 1; in the alternative, a material for the topical resin layers may be chosen with a higher resin content such that the relative permittivity is effectively brought down.

Figure 3:
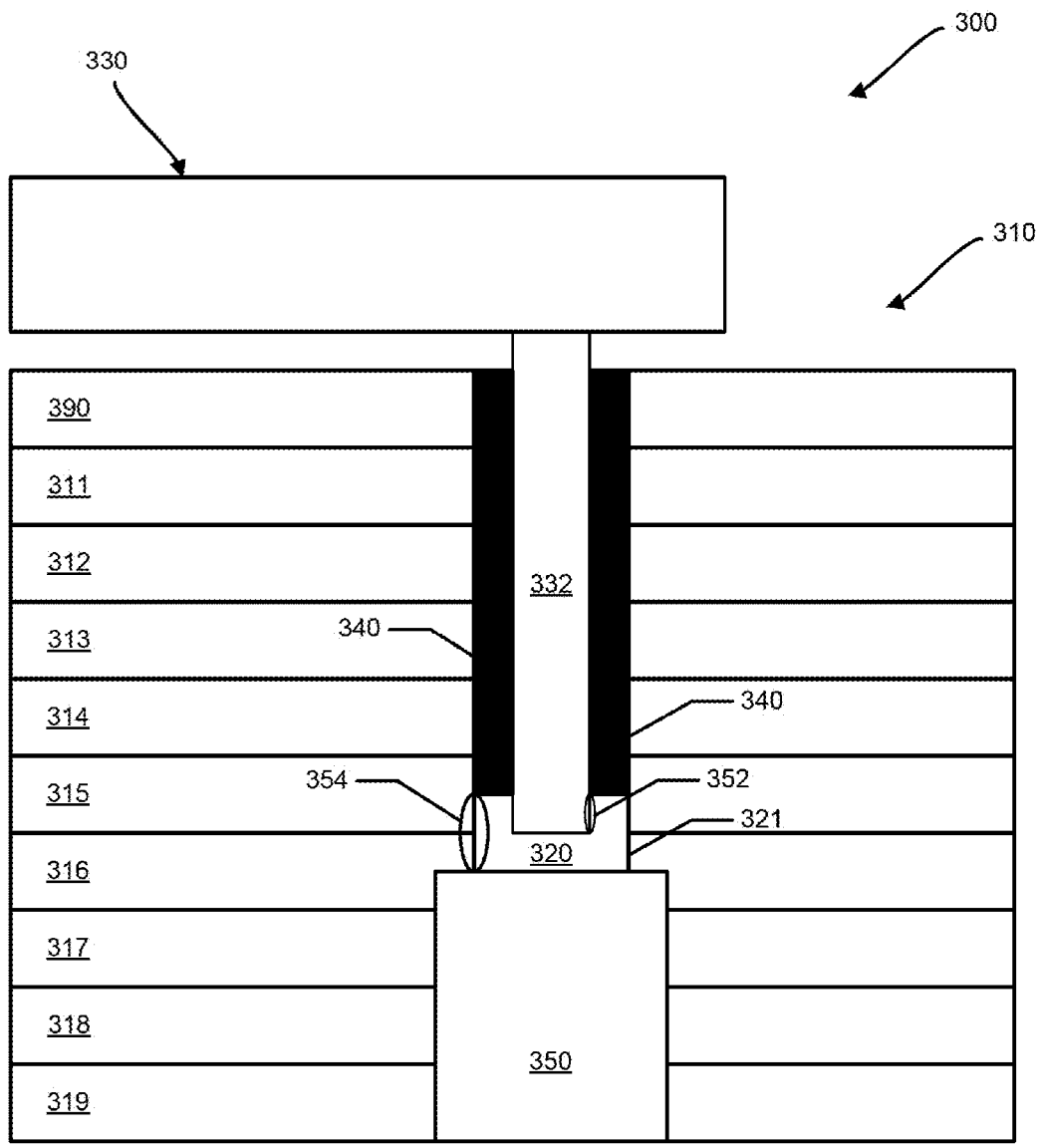
FIG. 3 is a schematic diagram of another PCB system.

FIG. 3 shows a more realistic illustration of a PCB system 300 in that it has more layers than PCB systems 100 and 200. PCB 310 includes layer 390 and multiple layers 311-319. PCB 310 further includes connection hole 320, which as can be seen from system 300 as a through-hole connection. More particularly, PCB 310 has a solder mask and/or plating layer 390, conduction layers 312, 314, 316, 318, and isolating layers 311, 313, 315, 317, and 319, which are formed of resins with a relative permittivities that electrically isolate conducting layers 312, 314, 316, and 318 from each other. As can be seen from system 300, conduction and isolating layers alternate, as indicated by the numbering of the layers, even numbers for conduction layers and odd numbers for resin (isolating) layers. Furthermore, the walls of connection hole 320 are plated with a conducting material, often metallic, such as a copper alloy with desirable conductive properties, to form conduction wall 321. Connection hole 320 is backdrilled by 350 such that conduction wall 321 is terminated by 350 at layer 316.

In system 300, electrical component 330 is coupled to PCB 310. Electrical component 330 has a connector pin 332 positioned in connection hole 320. Connector pin 332 is soldered to conduction wall 321 with solder portions 340 such that connector pin 332 is electrically connected to conduction wall 321. Because connector pin 332 is electrically connected to conduction wall 321, connector pin 332 may also be electrically connected to at least one of conduction layers 312, 314, and 316 via conduction wall 321. As can be seen from FIG. 3, a portion 352 of connector pin 332 may extend beyond the solder portions 340, and may be though of as a stub 352. Similarly, a portion 354 of conduction wall 321 extends beyond the solder portions 340, and may be though of as a stub 354. As can be seen from 300, top layer 390, and layers 311-316 are associated with a length of connector pin 332 and an unbackdrilled length of conduction wall 321. That is, the first three conduction and isolation layers (the first three topical layers) of PCB 310 are associated with a length of connector pin 332.

As can be seen from 300, a portion 352 of connector pin 332 may extend beyond the solder portions 340, and may be though of as a stub 352. Similarly, a portion 354 of conduction wall 321 extends beyond the solder portions 340, and may be though of as a stub 354. The length of stub 354 is determined by the backdrilling tolerance of backdrilling 350.

The relative permittivity of resin layers associated with the length of connector pin 332, namely layers 311, 313, and 315, may be chosen to mitigate the resonant and attenuation effects of stubs 352 and 354 in the electrical connection (defined by solder portions 340) between connector pin 332 and conduction wall 321. That is, the relative permittivity of resin lasers 311, 313, and 315 may be chosen to be less than the relative permittivity of other, non-topical resin layers. In the alternative, the resin content of resin layers 311, 313, and 315 may be increased so that the relative permittivity of layers 311, 313, and 315 is effectively brought down. By reducing the relative permittivity of layers 311, 313, and 315, the resonant and attenuation effects of stubs 352 and 354 in the electrical connection is mitigated as defined by the following equation:

$$\lambda f = C/\sqrt{\epsilon_r} \quad \text{Equation 2}$$

Where $\lambda$ is the wavelength of the signal, f is the frequency of the signal, c is the speed of light, and $\epsilon_r$ is the relative permittivity of the resin material layers proximate the connection. As can be seen from equation 2, decreasing the relative permittivity ($\epsilon_r$) has an inverse effect on the frequency f, such that frequency f is increased, that is, pushed out, such that frequencies below the increased resonance frequency may propagate through the connection with mitigated attenuation.

Figure 4:
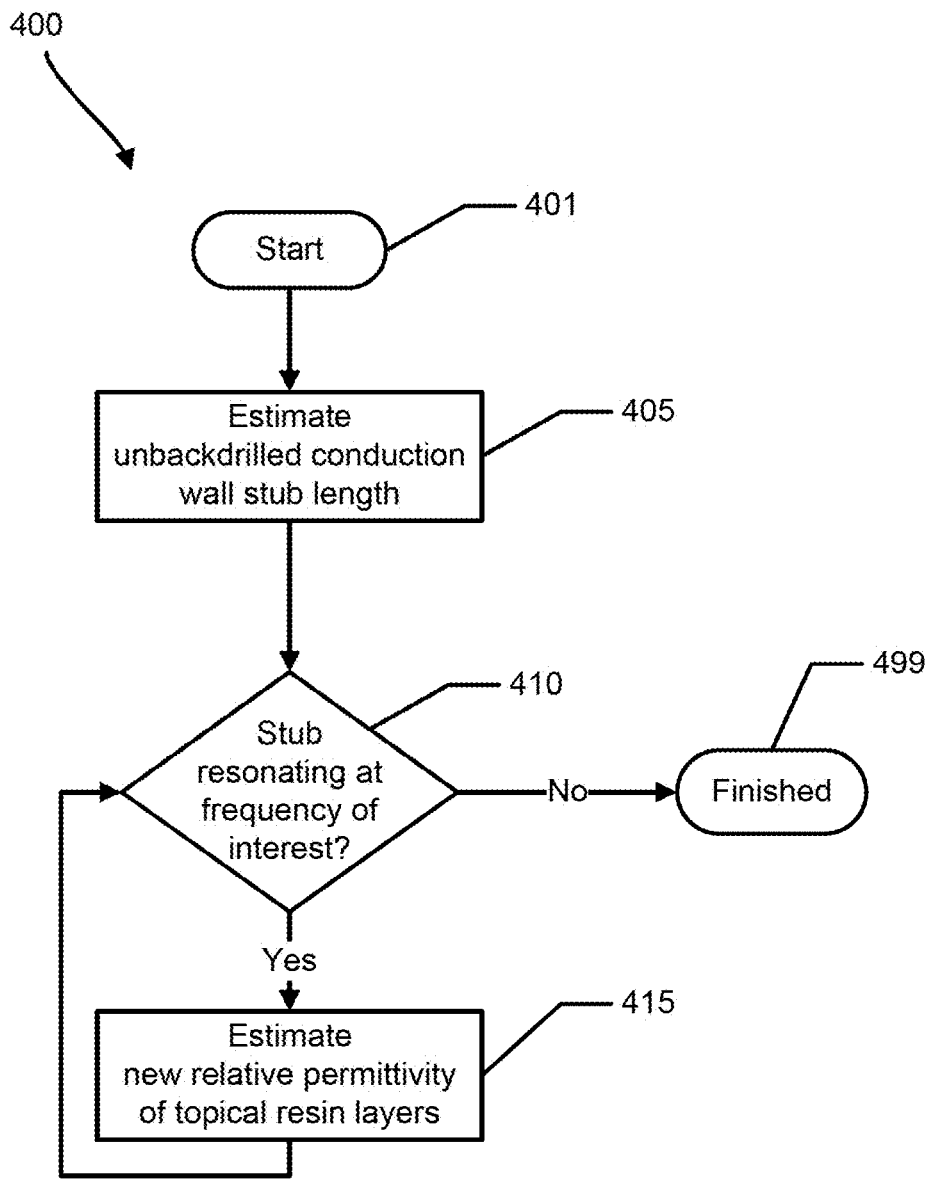
FIG. 4 is a flowchart of a method for selecting a relative permittivity of one or more resin layers of a PCB.

FIG. 4 shows a method 400 for selecting the relative permittivities of layers 311, 313, and 315 of PCB 310, for example, or the relative permittivities of topical layers generally, to mitigate resonant effects of stubs in a PCB electrical connection. At 401, the method begins. At 405, the length of the unbackdrilled portion of the conduction wall stub length is estimated, for example, the length of 354 of 300. At 410, it is determined whether the stub, for example, stub 354 of 300, will resonate at a frequency of interest. Namely, will the stub resonate at the frequency of a signal it is desired to propagate through the connection, for example, a frequency carrying data it is desired to transmit through the connection? If no, the process terminates at 499.

If it is determined that yes, the length of the unbackdrilled portion of the conduction wall stub length will resonate at the frequency of a signal it is desired to propagate through the connection, then at 415, a new relative permittivity of topical resin layers is determined, and the determination of 410 is again performed. Thus 415 and 410 are performed until a relative permittivity of the topical resin layers is determined that pushes out the frequency of resonance of the stub past the frequency of signals it is desired to propagate through the electrical connection.

Table 1 (below) is an example of PCB layers and corresponding PCB properties associated therewith:

TABLE 1

| Layer | Layer Type | Thickness (mils) | State | $\epsilon r$ |
|---|---|---|---|---|
| 0 | Top | 2.7 | unbackdrilled | fixed |
| 1a | Slurry Resin | 8.5 | unbackdrilled | variable |
| 1b | Conduction | 1.35 | unbackdrilled | |
| 1c | Resin | 8 | unbackdrilled | variable |
| 1d | Conduction | 1.35 | unbackdrilled | |
| 2a | Slurry Resin | 8.5 | unbackdrilled | variable |
| 2b | Conduction | 1.35 | unbackdrilled | |
| 2c | Resin | 8 | unbackdrilled | variable |
| 2d | Conduction | 1.35 | unbackdrilled | |
| 3a | Slurry Resin | 8.5 | unbackdrilled | variable |
| 3b | Conduction | 1.35 | unbackdrilled | |
| 3c | Resin | 8 | backdrilled | 3.4 |
| 3d | Conduction | 1.35 | backdrilled | |
| 4a | Slurry Resin | 8.5 | backdrilled | 3.4 |
| 4b | Conduction | 1.35 | backdrilled | |
| 4c | Resin | 8 | backdrilled | 3.4 |
| 4d | Conduction | 1.35 | backdrilled | |
| 5a | Slurry Resin | 8.5 | backdrilled | 3.4 |
| 5b | Conduction | 1.35 | backdrilled | |
| 5c | Resin | 8 | backdrilled | 3.4 |
| 5d | Conduction | 1.35 | backdrilled | |
| 6a | Slurry Resin | 8.5 | backdrilled | 3.4 |
| 6b | Conduction | 1.35 | backdrilled | |
| 6c | Resin | 8 | backdrilled | 3.4 |
| 6d | Conduction | 1.35 | backdrilled | |
| 7a | Slurry Resin | 8.5 | backdrilled | 3.4 |
| 7b | Conduction | 1.35 | backdrilled | |
| 7c | Resin | 8 | backdrilled | 3.4 |
| 7d | Conduction | 1.35 | backdrilled | |
| 8a | Slurry Resin | 8.5 | backdrilled | 3.4 |
| 8b | Conduction | 1.35 | backdrilled | |
| 8c | Resin | 8 | backdrilled | 3.4 |
| 8d | Conduction | 1.35 | backdrilled | |
| 9a | Slurry Resin | 8.5 | backdrilled | 3.4 |
| 9b | Conduction | 1.35 | backdrilled | |
| 9c | Resin | 8 | backdrilled | 3.4 |
| 9d | Conduction | 1.35 | backdrilled | |
| 10 | Bottom | 2.7 | backdrilled | fixed |

A PCB may be formed according to table 1. More particularly, a PCB may have a top layer 0 and a bottom layer 10. Layers 0 and 10 may include plating and solder masks. In between layers 0 and 10 are sets of layers 1 to 9. Each layer set 1-9 has a slurry resin layer a, a conduction layer b, a resin layer c, and a conduction layer d. As would be understood by one of skill in the art, in manufacture, the slurry resin layers a bind together the layer sets 1-9 by adhesion to the d layer immediately proceeding when the PCB is cured during manufacture. As can be seen from the alternating structure of the layers in the PCB as delineated by table 1, resin layers a and c alternate with conduction layers b and d, thereby isolating the conduction layers from each other.

As can be seen from table 1, layers 3c to 10 are backdrilled for a connection hole, and thus layers 3c to 10 will not form a portion of a resonating metallic stub (in the connection hole). Further, layers 3c to 10 will not be traversed by the pin of the electrical component. In contrast layers 0 to 3b are unbackdrilled and one or more layers of 0 to 3b will be traversed by the pin of the electrical component. A connection between the connection hole and pin will be formed by soldering at a depth in the PCB defined by layers 0 to 3b, which may be thought of as 'topical' layers. Topical layers are layers that may be traversed by a pin of an electrical component and may have a connection formed at that relative depth in the PCB. Thus, topical layers are proximate to the connection in that topical layers abut the connection and are at a relative depth of the connection in the PCB. Thus layers 0 to 3b may be thought of as topical layers.

The relative permittivity of topical resin layers, for example, as shown in table 1, layers 1a, 1c, 2a, 2c, and 3a, may be adjusted to control frequency attenuation caused by a conduction wall stub, as discussed above. In contrast, the backdrilled resin layers, namely layers 3c, 4a, 4c, 5a, 5c, 6a, 6c, 7a, 7c, 8a, 8c, 9a, and 9c, may be given a desired relative permittivity. This is shown in table 1: the backdrilled resin layers have a relative permittivity of 3.4, whereas the topical resin layers have a variable relative permittivity which may be varied in design and manufacture to mitigate frequency attenuation caused by a conduction wall stub, as discussed above. For example, the topical resin layers may have a relative permittivity 0.5 to 1 less than the relative permittivity of the backdrilled resin layers. Furthermore, different topical resin layers may have the same or different relative permittivities selected for the topical resin layers such that the permittivities of the topical resin layers may be heterogeneous or relatively homogenous, as determined by material tolerances.

Figure 5:
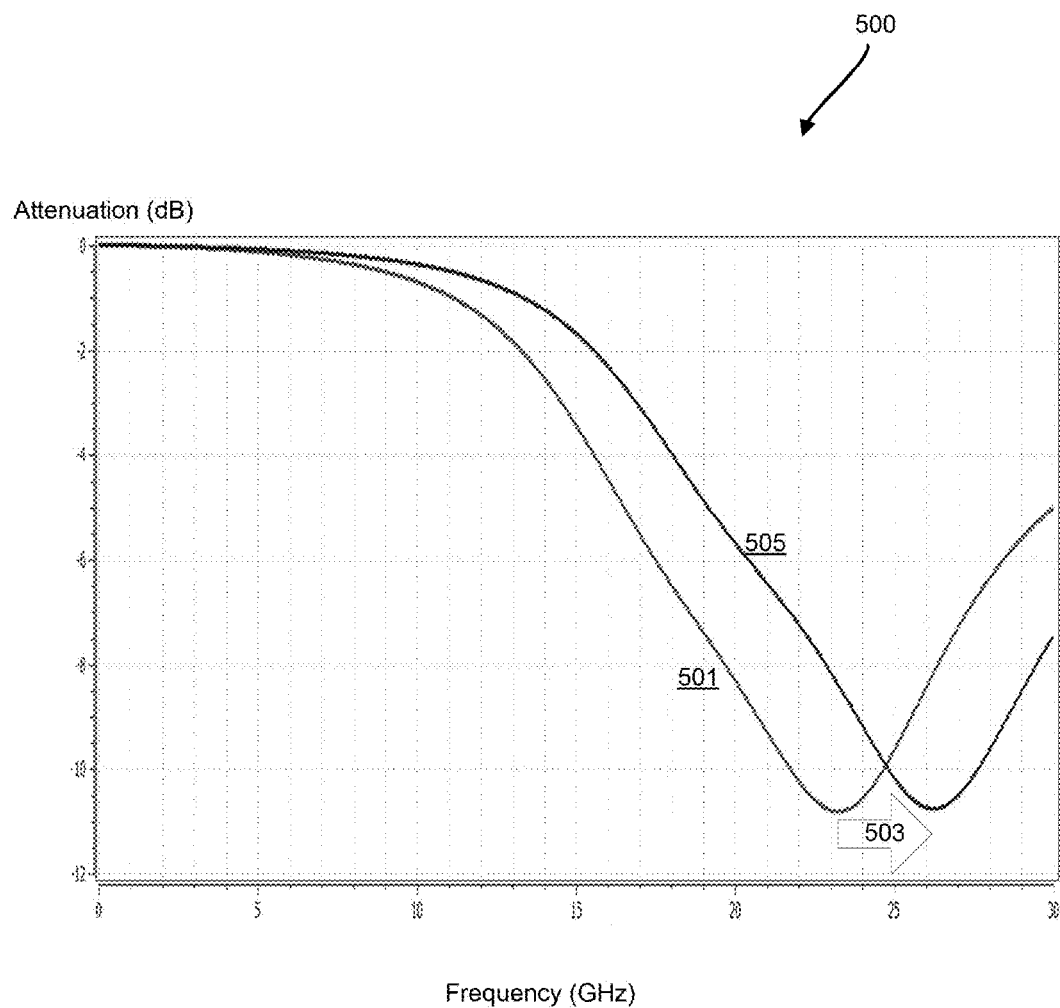
FIG. 5 is a graph of an example of attenuations in a PCB connection.

FIG. 5 is a graph 500 of attenuation in a PCB connection. Trace 501 illustrates attenuation of a PCB connection with backdrilling as the mechanism for reducing resonance of a conduction wall stub. Trace 505 illustrates attenuation of a PCB connection with backdrilling used in conjunction with adjusting the relative permittivity of topical resin layers in the proximity of a pin-conduction hole connection for reducing resonance of a conduction wall stub, in accordance with embodiments described above. As can be seen from graph 500, trace 501 has a maximum attenuation at a frequency lower than 25 GHz, whereas in contrast, trace 505 has a maximum attenuation at a frequency greater than 25 GHz. Thus, the frequencies affected by maximum attenuation at the connection have been pushed out beyond 25 GHz using methods and mechanisms described herein, as indicated by arrow 503.

Figure 6:
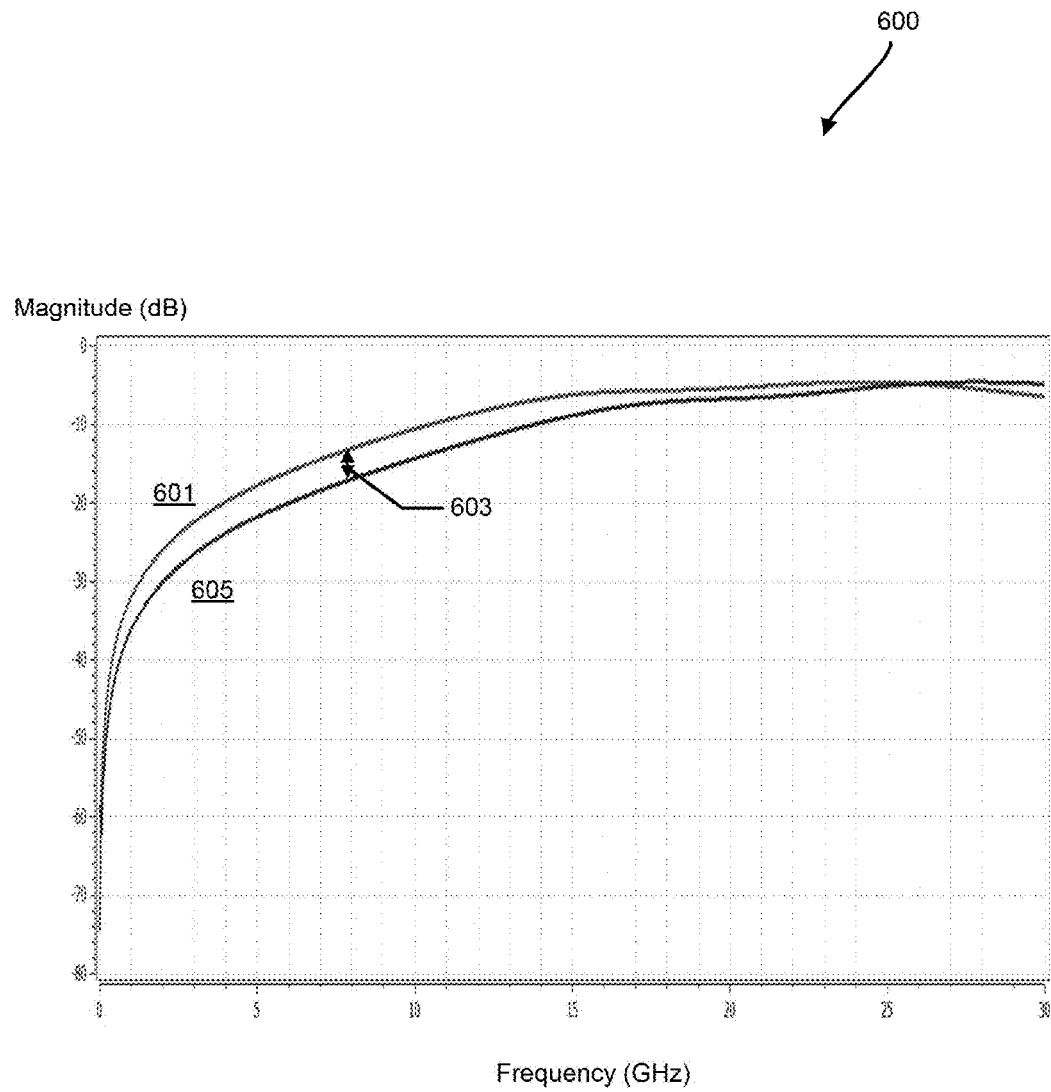
FIG. 6 is a graph of an example of reflections in a PCB connection.

FIG. 6 is a graph 600 of reflection in a PCB connection. Trace 601 illustrates reflection in a PCB connection with backdrilling as the mechanism for reducing impedance mismatch. Trace 605 illustrates reflection of a PCB connection with backdrilling used in conjunction with adjusting the relative permittivity of topical resin layers in the proximity of a pin-conduction hole connection for reducing impedance mismatch, in accordance with embodiments described above. As can be seen from graph 600, trace 605 has less reflection for frequency lower than 25 GHz than trace 601. Thus, the frequencies affected having less reflection at the connection have been pushed out past 25 GHz using methods and mechanisms described herein. Arrow 603 indicates a delta between 601 and 605.

The relative permittivity of topical resin layers discussed above may be selected to be the same, that is homogenous, or the relative permittivity of different topical resin layers may be selected to be different. Homogenous selection of topical resin layers may have advantages in that is may be easier to model the effects of relative permittivity on a PCB system.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

When referred to as a "device," a "module," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

The device or module can include software, including firmware embedded at a device, such as a Pentium class or PowerPC™ brand processor, or other such device, or software capable of operating a relevant environment of the information handling system. The device or module can also include a combination of the foregoing examples of hardware or software. Note that an information handling system can include an integrated circuit or a board-level product having portions thereof that can also be any combination of hardware and software.

Devices, modules, resources, or programs that are in communication with one another need not be in continuous communication with each other, unless expressly specified otherwise. In addition, devices, modules, resources, or programs that are in communication with one another can communicate directly or indirectly through one or more intermediaries.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
    estimating a length of a conduction wall stub in a printed circuit board (PCB);
    determining that the conduction wall stub will resonate at a first frequency;
    modifying a relative permittivity of a first resin layer of the PCB to be formed in proximity to the conduction wall stub relative to one or more other resin layers of the PCB to cause the conduction wall stub to resonate at a second frequency; and
    forming the PCB.

2. The method of claim 1, wherein the conduction wall stub is formed in a connection hole and the connection hole is backdrilled to reduce the length of the conduction wall stub.

3. The method of claim 2, wherein the first resin layer is a topical resin layer formed at a depth in the PCB proximate to a depth of a conducting portion of the connection hole.

4. The method of claim 1, further comprising increasing the relative permittivity of the first resin layer.

5. The method of claim 1, further comprising increasing a resin content of the first resin layer.

6. The method of claim 1, further comprising decreasing the relative permittivity of the first resin layer.

7. The method of claim 6, wherein the relative permittivity is decreased by 0.5 to 1.

8. A method comprising:
   estimating a backdrilling tolerance of a connection hole to be formed in a printed circuit board (PCB);
   estimating a length of a conduction wall stub formed from the connection hole based on the estimated backdrilling tolerance;
   determining that the conduction wall stub will resonate at a first frequency based on the estimated length of the conduction wall stub;
   modifying a relative permittivity of a first resin layer of the PCB to be formed in proximity to the conduction wall stub relative to one or more other resin layers of the PCB to cause the conduction wall stub to resonate at a second frequency; and
   forming the PCB.

9. The method of claim 8, further comprising:
   modifying a relative permittivity of a second resin layer of the PCB to be formed in proximity to the conduction wall stub relative to one or more other resin layers of the PCB to cause the conduction wall stub to resonate at the second frequency.

10. The method of claim 9, wherein the relative permittivities of the first and second resin layers are modified to be approximately the same relative permittivity.

11. The method of claim 9, wherein the relative permittivities of the first and second resin layers are modified to be different values of relative permittivity.

12. The method of claim 9, wherein the first and second resin layer are contained in a first three topical resin layers of the PCB.

13. The method of claim 8, wherein the second frequency is higher in frequency than the first frequency.

14. A method comprising:
   estimating a backdrilling tolerance of a connection hole to be formed in a printed circuit board (PCB);
   estimating a length of a conduction wall stub formed from the connection hole based on the estimated backdrilling tolerance;
   determining that the conduction wall stub will resonate at a first frequency based on the estimated length of the conduction wall stub;
   determining a depth of the connection hole to be traversed by a pin of an electrical component;
   determining a set of topical resin layers within the depth;
   modifying a relative permittivity of a first resin layer relative to one or more other resin layers of the PCB to cause the conduction wall stub to resonate at a second frequency, wherein the set of topical resin layers includes the first resin layer; and
   forming the PCB.

15. The method of claim 14, wherein the one or more other layers of the PCB excludes the set of topical resin layers.

16. The method of claim 14, wherein the resin layers of the set of resin layers have a homogenous relative permittivity.

17. The method of claim 14, wherein the resin layers of the set of resin layers have a heterogeneous relative permittivities.

18. The method of claim 14, wherein a connection is to be formed in the depth.

19. The method of claim 18, wherein the set of topical resin layers are to be proximate the connection.

20. The method of claim 18, wherein the conduction wall stub is to extrude from the connection.

* * * * *